United States Patent
Grover et al.

(10) Patent No.: US 6,787,376 B1
(45) Date of Patent: Sep. 7, 2004

(54) CREATING A PROCESS RECIPE BASED ON A DESIRED RESULT

(75) Inventors: Jason A. Grover, Austin, TX (US); Mark K. Sze-To, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/154,274

(22) Filed: May 22, 2002

(51) Int. Cl.[7] .............................................. H01L 21/66
(52) U.S. Cl. ........................................... 438/14; 438/16
(58) Field of Search ............................... 438/14, 15, 16, 438/17; 700/121, 182, 13

(56) References Cited

U.S. PATENT DOCUMENTS

| | | | | |
|---|---|---|---|---|
| 6,165,805 A | * | 12/2000 | Steffan et al. | 438/14 |
| 6,238,937 B1 | * | 5/2001 | Toprac et al. | 438/9 |
| 6,271,047 B1 | * | 8/2001 | Ushio et al. | 438/14 |
| 6,306,669 B1 | * | 10/2001 | Yano et al. | 438/14 |
| 6,368,884 B1 | * | 4/2002 | Goodwin et al. | 438/14 |
| 6,376,261 B1 | * | 4/2002 | Campbell | 438/8 |
| 6,428,673 B1 | * | 8/2002 | Ritzdorf et al. | 205/84 |
| 6,470,230 B1 | * | 10/2002 | Toprac et al. | 700/121 |
| 6,587,744 B1 | * | 7/2003 | Stoddard et al. | 700/121 |
| 6,622,059 B1 | * | 9/2003 | Toprac et al. | 700/121 |
| 2003/0066752 A1 | * | 4/2003 | Ritzdorf et al. | 205/82 |

\* cited by examiner

*Primary Examiner*—John F. Niebling
*Assistant Examiner*—Olivia T. Luk
(74) *Attorney, Agent, or Firm*—Williams, Morgan & Amerson, P.C.

(57) ABSTRACT

A method and apparatus is provided for creating a process recipe based on a desired result. The method comprises providing at least one workpiece to a processing tool for processing, providing the desired result for the workpiece to the processing tool, and generating a recipe for processing the workpiece based on the desired result.

6 Claims, 3 Drawing Sheets

CREATING A PROCESS RECIPE BASED ON A DESIRED RESULT

BACKGROUND OF THE INVENTION

1. Field of the Invention

This invention relates generally to a semiconductor fabrication process, and, more particularly, to creating a process recipe in the semiconductor fabrication process based on a desired result or outcome.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in continual improvements in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a group of semiconductor wafers, sometimes referred to as a "lot," using a variety of processing tools, including photolithography steppers, etch tools, deposition tools, polishing tools, rapid thermal processing tools, implantation tools, etc. The technologies underlying semiconductor processing tools have attracted increased attention over the last several years, resulting in substantial refinements in the fabrication process.

Typically, a recipe is provided to the processing tool, which then processes the incoming wafers according to the steps defined by the recipe. However, during the fabrication process, various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device. To reduce processing variation, various tools in the processing line are controlled, in accordance with performance models. Pre-processing and/or post-processing metrology data is supplied to process controllers for the processing tools. Operating recipe parameters, such as processing time, are calculated by the process controllers based on the performance model and the metrology information to attempt to achieve post-processing results as close to a target value as possible.

Reducing variation in the manner described above, however, may not necessarily effectively lead to increased throughput, reduced cost, higher device performance, and the like. For example, if the operating recipe parameters that are calculated based on the model data and metrology information are invalid or otherwise inaccurate, the processing tool may misprocess the wafers, thereby reducing the throughput and increasing the cost of the fabrication process.

The present invention is directed to overcoming, or at least reducing the effects of, one or more of the problems set forth above.

SUMMARY OF THE INVENTION

In one embodiment of the present invention, a method is provided for creating a process recipe based on a desired result. The method comprises providing at least one workpiece to a processing tool for processing, providing the desired result for the workpiece to the processing tool, and generating a recipe for processing the workpiece based on the desired result.

In another embodiment of the present invention an apparatus is provided for creating a process recipe based on a desired target result. The apparatus comprises an interface and a control unit. The control unit is adapted to receive an input from the interface indicative of the target result for at least one semiconductor wafer, receive the at least one semiconductor wafer for processing, and determine one or more process acts based on the received input to substantially achieve the target result.

In a further embodiment of the present invention, an article comprising one or more machine-readable storage media containing instructions is provided for creating a process recipe based on a desired result. The one or more instructions, when executed, enable the processor to receive a user input indicative of the desired result for at least one semiconductor wafer, receive at least one semiconductor wafer for processing, and determine one or more process acts based on the received user input to substantially achieve the desired result

BRIEF DESCRIPTION OF THE DRAWINGS

The invention may be understood by reference to the following description taken in conjunction with the accompanying drawings, in which like reference numerals identify like elements, and in which.

Figure 1:
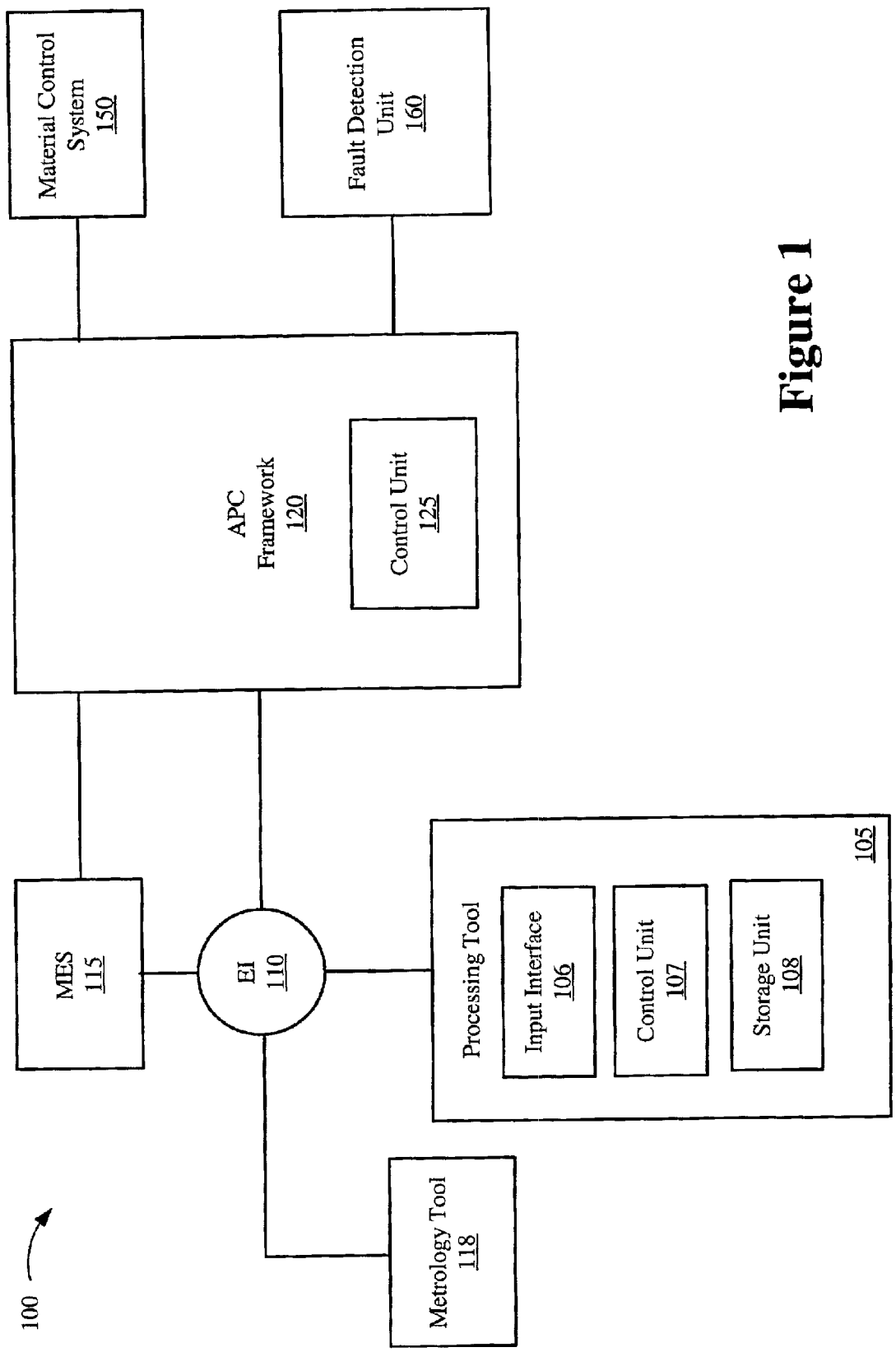
FIG. 1 illustrates a block diagram of a manufacturing system for processing workpieces by a processing tool, in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Turning now to the drawings, and specifically referring to FIG. 1, a manufacturing system 100 for performing a semiconductor fabrication process is provided. The manufacturing system 100 includes a processing tool 105, which in the illustrated embodiment, is in the form of semiconductor fabrication equipment used to produce a processing piece, such as a silicon wafer. The techniques described herein may be applied to a variety of workpieces including, but not limited to, microprocessors, memory devices, digital signal processors, application specific integrated circuits (ASICs), or other similar devices.

The processing tool 105, in accordance with one embodiment, may be an exposure tool, etch tool, deposition tool, polishing tool, rapid thermal processing tool, test-equipment tool, implantation tool, and the like. It will be appreciated, however, that the processing tool 105 need not necessarily be limited to a processing tool 105 for producing silicon wafers, but may include various other types of manufacturing equipment for producing a variety of different types of commercial products without departing from the spirit and scope of the present invention.

The processing tool 105, in the illustrated embodiment, includes an input interface 106, control unit 107, and storage unit 108. As described in more detail below, in accordance with one embodiment of the present invention, the input interface 106 allows a wafer fabrication technician to provide the desired target result for the workpieces that are to be processed by the processing tool 105. Based on the desired target result, in one embodiment, the control unit 107 of the processing tool 105 generates one or more recipes, which may be stored in the storage unit 108. The processing tool 105 then processes the workpieces according to the generated recipes to achieve the desired target result.

The processing tool 105 is coupled to an equipment interface (EI) 110, which interfaces the processing tool 105 to a manufacturing execution system (MES) 115. The manufacturing execution system 115 manages and controls the overall operation of the processing tool 105. For example, the manufacturing execution system 115 may determine what processes are to be performed by the processing tool 105, when these processes are to be performed, how these processes are to be performed, etc.

A metrology tool 118 may also be coupled to the equipment interface 10 to retrieve wafer-related data that characterizes the quality of the wafer that is processed by the processing tool 105. The wafer product data is generated from specific quantitative and/or qualitative measurements that are taken from the wafer by the metrology tool 118. For example, the wafer product data may include film thickness measurements, line width measurements, and/or overlay offset measurements of the wafer. It will be appreciated that these specific measurements that define the wafer product data are merely exemplary. Accordingly, various other measurements that describe the quantitative or qualitative characteristics of the wafer may also be taken to determine whether the wafers that are being processed by the processing tool 105 possess the quantitative or qualitative characteristics desired. The specific manner in which the wafer product data is obtained by the metrology tool 118 is well known to those of ordinary skill in the art and the details of such will not be discussed herein to avoid unnecessarily obscuring the present invention.

The equipment interface 110 may retrieve metrology data from the metrology tool 118, and communicate this data to an Advanced Process Control (APC) framework 120, which may include a control unit 125 for managing at least the overall operations of the APC framework 120. An exemplary APC framework 120 that may be suitable for use in the manufacturing system 10 may be implemented using the Catalyst system offered by KLA-Tencor, Inc. The Catalyst system uses Semiconductor Equipment and Materials International (SEMI) Computer Integrated Manufacturing (CIM) Framework compliant system technologies and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI, which is headquartered in Mountain View, Calif. The APC framework 120, in one embodiment, may be coupled to a fault detection unit 160.

The manufacturing execution system 115 generally determines which particular lot of wafers needs to be processed by the processing tool 105 subsequent to the processing tool 105 running a current lot of wafers. After the manufacturing execution system 115 determines the particular lot of wafers that should run next on the processing tool 105, a wafer fab technician sends a message to a material control system 150, via an operator interface (not shown), for example, to have the material control system 150 retrieve the desired lot of wafers that is stored in a wafer storage facility. Typically, various lots of wafers are stored in the wafer storage facility within a plurality of "stockers" (not shown), which may include several shelving units that accommodate the storage of the wafers. The material control system 150 usually includes robotic equipment that is capable of locating a desired lot of wafers within one of the stockers of the storage facility, and then removing the desired lot of wafers from the stocker in which the lot is stored for subsequent delivery to the processing tool 105.

Typically, when the desired lot of wafers is delivered to the processing tool 105, the technician informs the manufacturing execution system 115 via an operator interface, for example, that the lot of wafers is at the processing tool 105 such that the processing tool 105 may run the lot of wafers. The manufacturing execution system 115, upon receiving notification that the lot of wafers has arrived at the processing tool 105, sends a message to the equipment interface 110.

accordance with one embodiment of the present invention, the message from the manufacturing execution system 115 instructs the processing tool 105 of the target result that is desired for a given lot of wafers. In an alternative embodiment, instead of the MES 115 instructing the processing tool 105 of the desired result, a technician may manually enter the desired result via the input interface 106 of the processing tool 105. In one embodiment the target result may be provided to the processing tool 105 through the APC framework 120 and the equipment interface 110 associated with the processing tool 105. Based on the target result, in one embodiment, the processing tool 105 determines one or more recipes and then executes those recipes to attempt to substantially achieve that target result. For example, a desired result for a given lot of wafers may be to achieve a final oxide thickness of 200 Angstroms. Based on this desired result of an oxide thickness of 200 Angstroms, the processing tool 105, in one embodiment, generates a recipe to achieve the desired oxide thickness.

Figure 2:
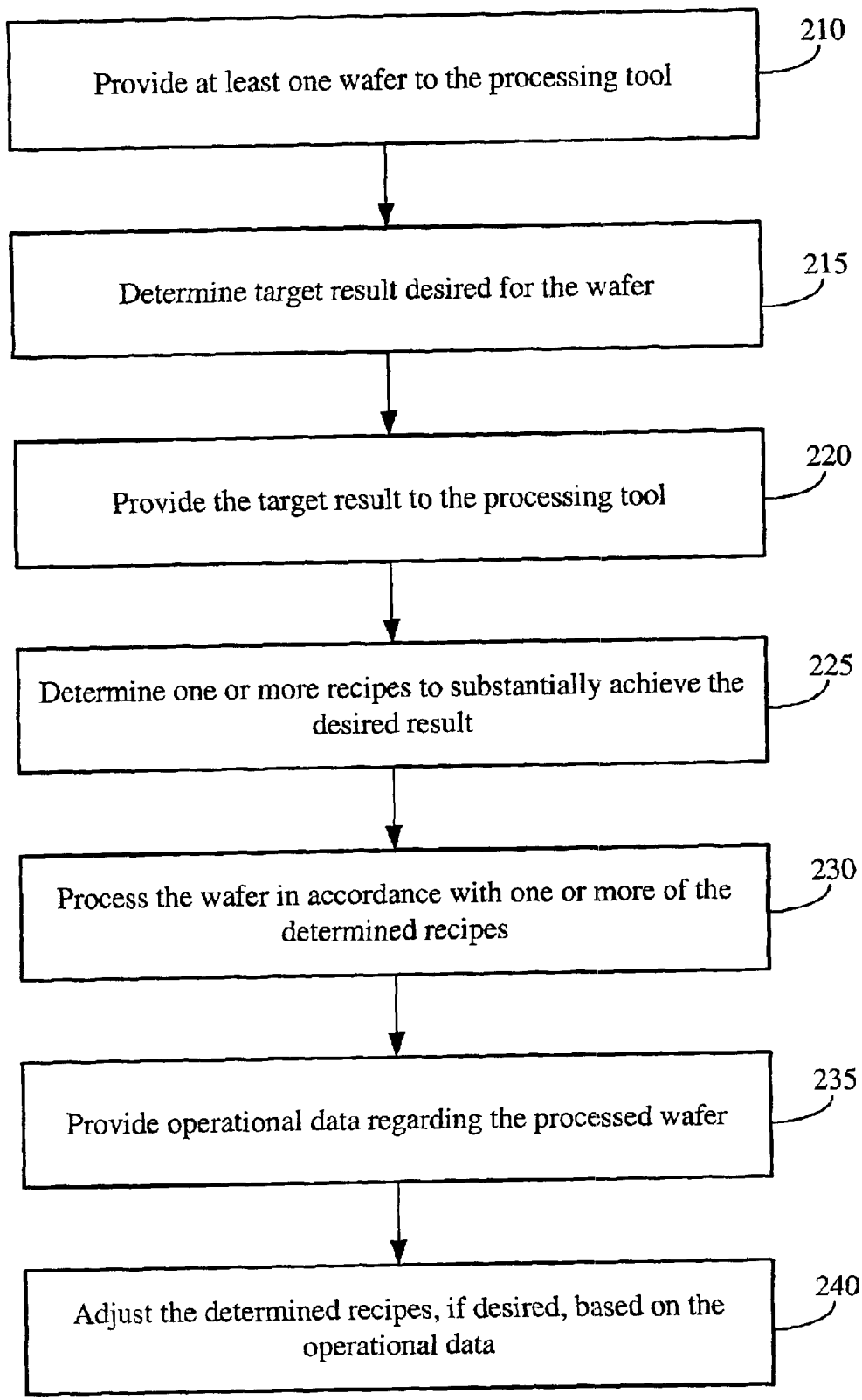
FIG. 2 shows a flow diagram of a method that may be implemented in the manufacturing system of FIG. 1, in accordance with one embodiment of the present invention.

Turning now to FIG. 2, a flow diagram of a method that may be implemented in the manufacturing system 100 is shown, in accordance with one embodiment of the present invention. The manufacturing execution system 115 identifies at least one wafer to process and provides (at 210) the wafer to the processing tool 105. Typically, the manufacturing executing system 115 provides (at 210) a lot of wafers to the processing tool 105. Providing the wafer (at 210), in one embodiment, may include instructing a wafer fab technician to provide the identified wafer to the processing tool 105. In accordance with another embodiment, the manufacturing execution system 115 may instruct the material control system 150 to move the identified wafer to the processing tool 105 using an automated process, using robotical arms or conveyor belts, for example.

The manufacturing execution system 115 determines (at 215) a target result that is desired for the wafer that is provided (at 210) to the processing tool 105. In an alternative embodiment, the target result may be determined (at 215) by a fab technician instead of the manufacturing executing system 115. The desired target result may vary from implementation to implementation, depending on the desired objectives. For example, in one embodiment, the desired target result may include a deposited material on the wafer to be etched to a desired depth, a material to be implanted on the wafer to a selected height, a material on the wafer to be polished to a desired level, and the like.

The target result determined (at 215) is provided (at 220) to the processing tool 105. The target result may be provided (at 220) to the processing tool 105 in a variety of ways, as explained above. For example, in one embodiment, the target result may be provided (at 220) by the manufacturing execution system 115 to the processing tool 105 through the APC framework 120 and the equipment interface 110. In another embodiment, the fab technician may manually provide the target result to the processing tool 105 through the input interface 106.

The processing tool 105 determines (at 225) one or more recipes to at least substantially achieve the desired result. As explained in more detail below with reference to FIG. 3, the recipes may include one or more process acts that may be performed on the wafer to at least substantially achieve the desired result. It should be appreciated that while the goal of the processing tool 105 may be to achieve the precise desired result, such results may not always be possible because of a variety of factors, such as unexpected or undesirable ambient conditions, imperfections in the incoming wafer or in the chemicals employed by the processing tool 105, improperly calibrated components of the processing tool 105, and the like. Despite the above-mentioned unpredictable contingencies, because the processing tool 105 determines the recipe to achieve the desired result, in accordance with one embodiment of the present invention, the processing tool 105 may be in a better position to account for such contingencies while attempting to achieve the desired result. In some instances, depending on the circumstances, the processing tool 105 may be able to achieve the precise result desired.

The processing tool 105 processes (at 230) the wafer in accordance with the one or more of the recipes determined (at 225) previously. In one embodiment, the processing tool 105 may provide (at 235) operational data regarding the processed wafer. In one embodiment, the operational data may include any wafer-related data provided by the processing tool 105, which may, for example, be stored in the fault detection unit 160 and utilized to identify any deviations in the desired results. In one embodiment, the metrology tool 118 may provide operational data, in the form of metrology data, relating to the wafer processed by the processing tool 105. The metrology data may also be stored in the fault detection unit 160 and utilized to determine any deviations in the desired results. The term "operational data," as utilized herein, may include wafer-related data and/or metrology data.

In one embodiment, the processing tool 105 adjusts (at 240) the recipes determined (at 225), if desired, based on process deviations detected in the operational data. This feedback mechanism may allow the processing tool 105 to account for deviations that may have occurred with the wafers processed earlier.

Figure 3:
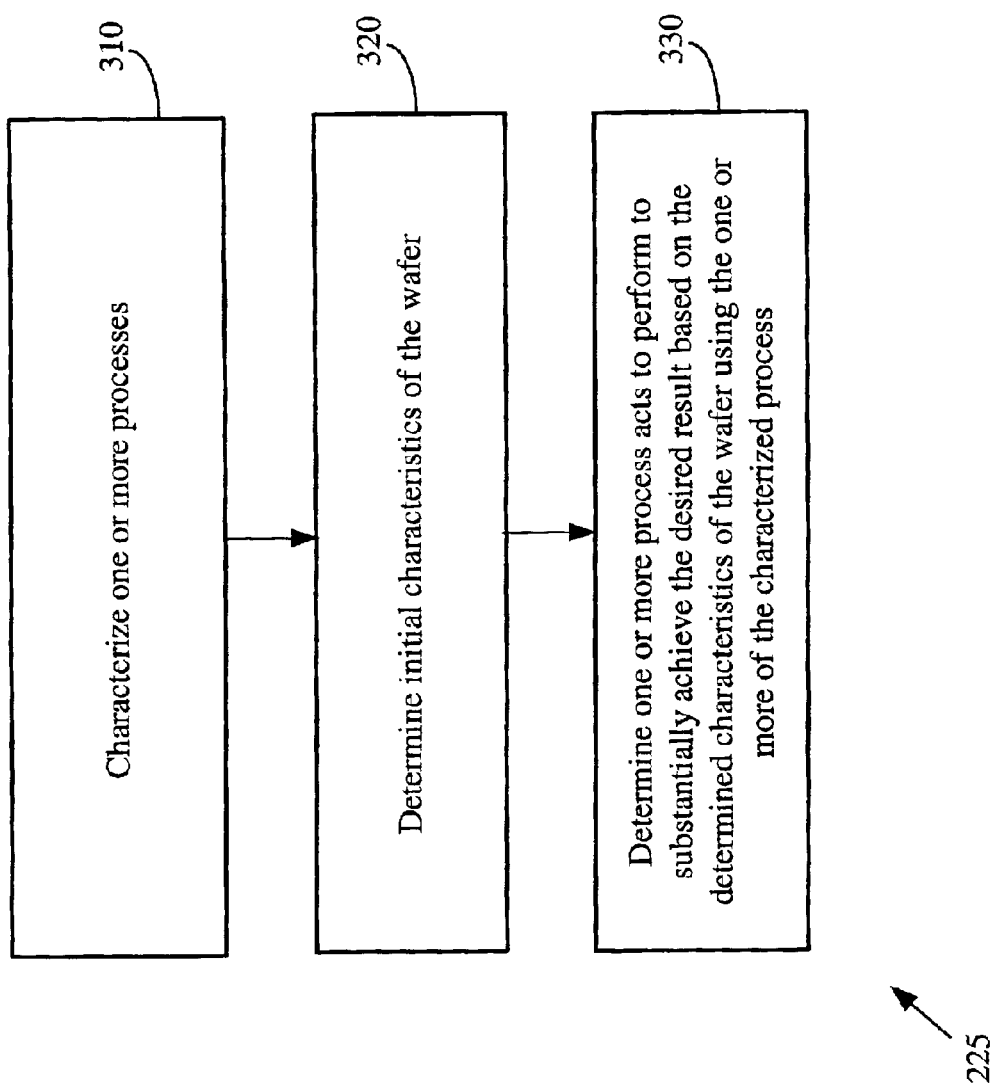
FIG. 3 illustrates a flow diagram of an alternative method that may be implemented in the manufacturing system of FIG. 1, in accordance with another embodiment of the present invention.

Referring now to FIG. 3, a flow diagram of a method for determining one or more recipes that may be employed by the processing tool 105 to process the wafer is illustrated, in accordance with one embodiment of the present invention. In particular, FIG. 3 illustrates one embodiment of the step of the block 225 of FIG. 2 of determining the one or more recipes.

The processing tool 105, based on user input, characterizes (at 310) one or more processes that is performable by the processing tool 105. Characterizing the one or more processes (at 310) may include, for example, defining how a particular species interacts with an oxide layer, metal, and the like. Similarly, in other embodiments, characterizing the one or more processes (at 310) may include a concentration of a bulk chemical dopant with the rate of penetration of bulk chemical dopant into an exposed material layer on a wafer or the energy content or intensity of a plasma stream with the rate of erosion of a targeted material layer.

The processing tool 105 determines (at 320) the initial characteristics of the wafer. Determining the initial characteristics (at 320) of the wafer may include, for example, measuring selected physical characteristics of the wafer. The particular physical characteristics that are measured may depend on the process steps that are to be performed on the wafer. For example, when baking a wafer, the overall baking time may depend on the amount of material that has been implanted on the wafer. As such, it may be desirable to measure the amount of material that has been deposited on the wafer to calculate an optimal baking time. As another example, in one embodiment, determining the initial characteristics (at 320) of the wafer may include determining the orientation of the wafer.

It should be noted that the act of determining the initial characteristics of the wafer (at 320) may not be desirable or otherwise needed in certain instances. For example, a processing tool 105 that is adapted to etch deposited material on the wafer to a predefined depth may be able to do so without determining the initial processing state of that wafer. Thus, the act of determining the initial characteristics (at 320) of the wafer may or may not be desirable, depending on the implementation.

The processing tool 105 determines (at 330) one or more process acts to perform to substantially achieve the determined desired target result (at 215—see FIG. 2) based on the determined characteristics (at 310) of the wafer using the one or more of the process characterizations. That is, because of the earlier process characterizations, the processing tool 105, in one embodiment, is able to determine one or more process acts that are desirable to at least substantially achieve the desired result. In one embodiment, the processing tool 105, depending on the type of result desired, may determine that a particular type of resource (e.g., Boron) may be more desirable to use over another type of resource (e.g., Arsenic in an implanting process). The processing tool 105 may be similarly able to make other types of determinations to substantially achieve the desired result.

The various system layers, routines, or modules may be executable by the control units 125, 107 (see FIG. 1). As utilized herein, the term "control unit" may include a microprocessor, a microcontroller, a digital signal processor, a processor card (including one or more microprocessors or controllers), or other control or computing devices. The storage unit 108 (see FIG. 1) referred to in this discussion may include one or more machine-readable storage media for storing data and instructions. The storage media may include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy, removable disks; other magnetic media including tape; and optical media such as compact disks (CDs) or digital video disks (DVDs). Instructions that make up the various software layers, routines, or modules in the various systems may be stored in respective storage devices. The instructions when executed by a respective control unit cause the corresponding system to perform programmed acts.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

providing at least one workpiece to a processing tool for processing;

providing a desired result for the workpiece to the processing tool; and generating a recipe for processing the workpiece based on the desired result.

2. The method of claim 1, further comprising processing the workpiece in accordance with the generated recipe.

3. The method of claim 2, wherein processing the workpiece comprises processing a semiconductor wafer.

4. The method of claim 1, wherein providing the at least one workpiece comprises providing a lot of wafers.

5. The method of claim 1, wherein generating the recipe comprises characterizing one or more processes to be performed on the workpiece.

6. The method of claim 1, wherein generating the recipe comprises determining at least one initial characteristic of the workpiece.

* * * * *

UNITED STATES PATENT AND TRADEMARK OFFICE
CERTIFICATE OF CORRECTION

PATENT NO. : 6,787,376 B1
DATED : September 7, 2004
INVENTOR(S) : Jason A. Grover and Mark K. Sze-To It is certified that error appears in the above-identified patent and that said Letters Patent is hereby corrected as shown below:

Column 3,
Line 45, replace "interface 10" with -- interface 110 --.

Column 4,
Line 44, insert at the beginning of the paragraph the word -- In --.

Signed and Sealed this

Fourteenth Day of December, 2004

JON W. DUDAS
*Director of the United States Patent and Trademark Office*